(12) United States Patent
Posseme et al.

(10) Patent No.: US 10,497,627 B2
(45) Date of Patent: Dec. 3, 2019

(54) METHOD OF MANUFACTURING A DOPANT TRANSISTOR LOCATED VERTICALLY ON THE GATE

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Laurent Brunet, Grenoble (FR); Perrine Batude, Dijon (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 178 days.

(21) Appl. No.: 15/421,641

(22) Filed: Feb. 1, 2017

(65) Prior Publication Data
US 2017/0221767 A1 Aug. 3, 2017

(30) Foreign Application Priority Data
Feb. 2, 2016 (FR) ...................... 16 50807

(51) Int. Cl.
*H01L 21/8238* (2006.01)
*H01L 21/02* (2006.01)
(Continued)

(52) U.S. Cl.
CPC ........ *H01L 21/823814* (2013.01); *H01L 21/02115* (2013.01); *H01L 21/31111* (2013.01);
(Continued)

(58) Field of Classification Search
CPC ....... H01L 21/823814; H01L 21/02115; H01L 21/31111; H01L 29/41783; H01L 29/6656;
(Continued)

(56) References Cited

U.S. PATENT DOCUMENTS

| 6,287,979 B1 | 9/2001 | Zhou et al. |
| 2003/0010746 A1 | 1/2003 | Gutierrez et al. |

(Continued)

FOREIGN PATENT DOCUMENTS

| EP | 2 975 645 A1 | 1/2016 |
| FR | 3 009 651 A1 | 2/2015 |
| WO | WO 2004/007349 A1 | 1/2004 |

OTHER PUBLICATIONS

French Preliminary Search Report (with Written Opinion) dated Oct. 20, 2016 in French Application 16 50807 filed on Feb. 2, 2016 (with English Translation of Categories of Cited Documents).

*Primary Examiner* — Timor Karimy
(74) *Attorney, Agent, or Firm* — Oblon, McClelland, Maier & Neustadt, L.L.P.

(57) ABSTRACT

A method is provided for forming a transistor from a stack including the following successive layers: an electrically insulating layer, an active zone including at least one semiconductor layer, and a gate, sides of which are configured to be covered by at least one spacer, the method including: a phase of forming lateral cavities; and forming a raised drain and a raised source that fill the lateral cavities by growing the semiconductor layer via epitaxy, the forming of the lateral cavities includes, after a step of partially removing the semiconductor layer: forming a sacrificial layer, partially removing the sacrificial layer; forming spacers against the sides of the gate resting on a residual sacrificial layer; and totally removing the residual sacrificial layer in order to form the lateral cavities.

17 Claims, 7 Drawing Sheets

(51) Int. Cl.
*H01L 21/311* (2006.01)
*H01L 29/417* (2006.01)
*H01L 29/66* (2006.01)
*H01L 29/786* (2006.01)

(52) U.S. Cl.
CPC .... *H01L 29/41783* (2013.01); *H01L 29/6656* (2013.01); *H01L 29/66575* (2013.01); *H01L 29/66636* (2013.01); *H01L 29/66772* (2013.01); *H01L 29/78618* (2013.01); *H01L 29/78654* (2013.01)

(58) Field of Classification Search
CPC ......... H01L 29/66575; H01L 29/66636; H01L 29/66772
See application file for complete search history.

(56) References Cited

U.S. PATENT DOCUMENTS

| | | |
|---|---|---|
| 2004/0072446 A1 | 4/2004 | Liu et al. |
| 2014/0252500 A1 | 9/2014 | Cheng et al. |
| 2014/0252501 A1 | 9/2014 | Cheng et al. |
| 2015/0044841 A1 | 2/2015 | Batude et al. |
| 2016/0020152 A1 | 1/2016 | Posseme |

METHOD OF MANUFACTURING A DOPANT TRANSISTOR LOCATED VERTICALLY ON THE GATE

TECHNICAL FIELD

The present invention relates to a method for manufacturing a transistor having local dopant vertically aligned with the gate.

The field of the invention relates to the microelectronics industry and in particular to the production of transistors.

It has a favoured but non-limiting use in the production of a MOSFET-SOI transistor used for manufacturing all sorts of integrated circuits.

PRIOR ART

The endless race to reduce size that characterises the entire microelectronics industry was made possible by the contribution of key innovations over decades of development since the first integrated circuits were industrially produced in the nineteen-sixties. A very important innovation that dates to the nineteen-seventies and is still in use today is the production of MOSFET transistors using a technique in which the source and drain electrodes are self-aligned with the gate electrodes and do not therefore require a photolithography operation in order to be defined. Combined with the use of gates made of polycrystalline silicon, it is the gates themselves, which are created first, that are used as a mask during the doping of the source and drain regions of the transistors.

Figure 1:
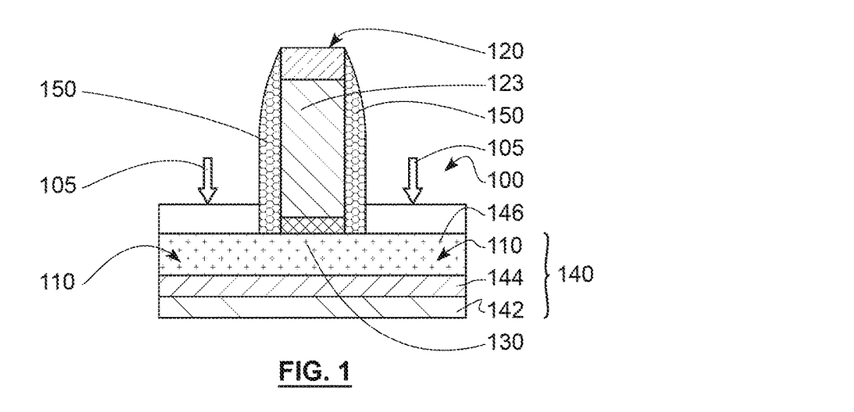
FIG. 1 illustrates a cross-section of an FDSOI MOSFET transistor of the prior art being manufactured.
Figure 2A:
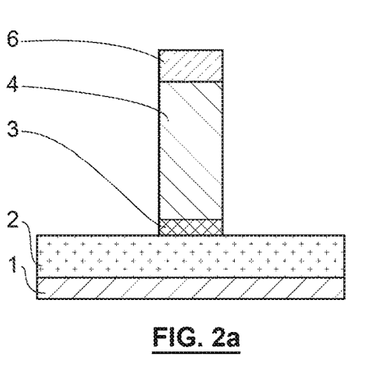
FIGS. 2a) to 2d) illustrate a manufacturing method according to the prior art.
Figure 2B:
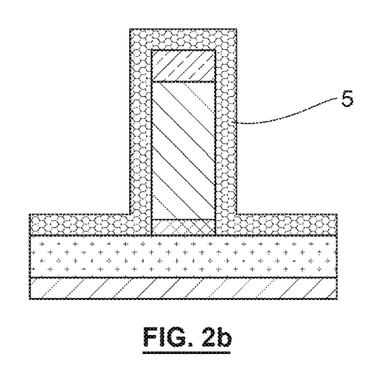
Figure 2C:
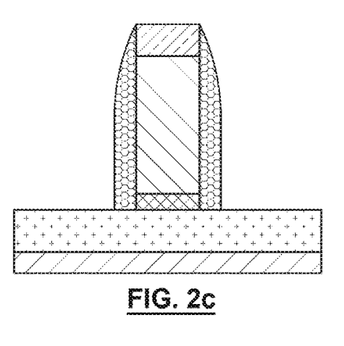
Figure 2D:
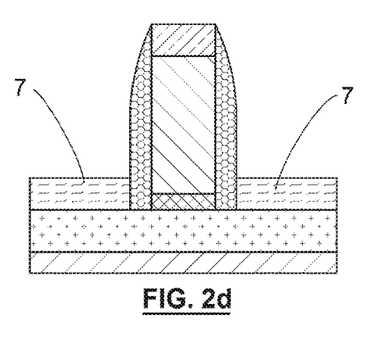

FIG. 1 is a cross-sectional view of an example of this type of transistor 100 being manufactured. The source and drain regions 110 can be seen in this figure and are generally designated source/drain regions since said regions are very generally perfectly symmetrical and can act as both according to the electric polarisation that is applied to the transistor. The gate 120 conventionally consists of a stack of layers, a large portion of which always consists of polycrystalline silicon 123. The formation of the source and drain regions is typically carried out via ion implantation 105 of dopants in the regions 110, the gate 120 acting as a mask as mentioned above, thus preventing the doping of the region of the MOSFET transistor in which, according to the voltages applied to the gate, the conducting channel 130 between source and drain can be formed.

The basic technique well known to a person skilled in the art, very briefly described above, and numerous variations have been continually perfected in order to improve the electric performance of the transistors while providing for the successive reductions in the size of the transistors, required by an ever-growing integration of more and more components into an integrated circuit.

A technique currently widely used involves manufacturing the integrated circuits from elaborate silicon-on-insulator substrates 140, designated by the acronym thereof, SOI. The elaborate SOI substrate is characterised by the presence of a fine surface layer of monocrystalline silicon 146 resting on a continuous layer of silicon oxide 144, called buried oxide or BOX, acronym for "buried oxide layer." The solidity and the mechanical rigidity of the assembly are provided by the layer 142 that forms the body of the SOI substrate, often described by the English term "bulk" in order to indicate that the starting substrate is very generally made of bulk silicon. This structure provides numerous advantages for the production of MOSFET transistors. Namely, this structure allows a drastic reduction in the parasitic capacitances because of the presence of the continuous insulating layer 144.

An improvement of the basic self-alignment technique that was universally adopted is the formation of spacers 150 on the sides of the gate. The spacers 150, typically made of silicon nitride (SiN), in particular allow a technique called "Raised Source and Drain" to be implemented. In order to be able to maintain low electric resistances of access to the source and drain electrodes despite the reduction in the size of the transistors, the cross-section of said transistors had to be increased. This is obtained by selective epitaxy of the source/drain regions 110. During this operation, the initial layer of monocrystalline silicon 146 is grown locally. The gate regions thus have to be protected in order to prevent the growth from also occurring on the polycrystalline silicon 123 of the gate. The role of the spacers, inter alia, is to carry out this function. They also have the function of preserving the gate during the silicidation of the contacts (not shown), which is subsequently carried out with the same goal in order to reduce the series resistance of access to the electrodes of the transistor.

These steps of forming spacers and a raised source and drain are shown in FIGS. 2a to 2d.

For a pMOS, SiGe with a variable percentage of Ge, is integrated in order to product a uniaxial compressive stress in the channel, for an nMOS epitaxy of SiC is used to produce a uniaxial tensile stress.

The epitaxied source and drain are doped in situ, that is to say, during the deposition. In order to properly connect the channel to the source and to the raised drain, that is to say, to dope the zone located under the gate spacer, high-temperature annealing, usually called "driving anneal", is used. This annealing is generally carried out at a very high temperature for a very short time (usually called "spike" annealing) at over 1000° C.

For the production of a transistor on a thin film, made with a limited thermal budget, this type of diffusion annealing at high temperature cannot be used.

To connect the channel, one possible solution is to use "low doped drain" implantation, that is to say, with a low dose, typically inclined implantation (with an angle of 15-25°) with a dose of dopant of approximately $1 \times 10^{15}$ at/cm2.

This type of implantation has several disadvantages with respect to the high-temperature method. First of all, this requires the addition of two additional lithographic layers LDDN and LDDP (creation of a lithographic layer with a low dose of dopants for the nMOS portion and creation of a lithographic layer with a low dose of dopants for the pMOS portion). Moreover, the implantation through the Si/SiGe and Si/SiC interface may be faulty. Indeed, doping via implantation through a semiconductor layer made from a different material than that of the semiconductor regions formed via epitaxy on either side of the gate can lead to stress relaxation and to an increase in the junction leaks.

From patent application FR3009651A1, a method is known for the production of a transistor in which sacrificial areas are formed in a semiconductor layer on either side of a given region intended to form a channel of the transistor. These sacrificial areas are formed via deposition of material containing silicon that is different from the material forming the semiconductor layer. The material described is SiGe on a semiconductor layer of silicon or vice versa. The sacrificial areas are removed, leaving cavities that penetrate under gate spacers on either side of said given region.

This method, however, requires a significant step number, and in particular a step of deposition and/or epitaxy of the sacrificial layer that prolongs and complicates the method.

There is therefore a need to find a new method for manufacturing transistors that have better performance and overcome the disadvantages mentioned above.

SUMMARY OF THE INVENTION

For this purpose, the present invention proposes a method for forming at least one transistor from a stack comprising the following successive layers: an electrically insulating layer, an active zone comprising at least one layer of semiconductor material and a gate, the sides of which are intended to be covered by at least one spacer, the method comprising:
- a phase of forming lateral cavities on either side of a given region of the semiconductor layer suitable for forming a channel of the transistor, comprising a step of partially removing the semiconductor layer on either side of the given region, and
- a step of forming a raised drain and a raised source that fill the lateral cavities by growing the semiconductor layer via epitaxy.

The phase of forming lateral cavities comprises, after the step of partially removing the semiconductor layer:
- a step of forming a sacrificial layer on either side of the given region via spin coating with an organic compound, the sacrificial layer having a thickness at least equal to the depth of the lateral cavities formed in the semiconductor layer,
- a step of partially removing the sacrificial layer configured to preserve a residual sacrificial layer having a thickness at least equal to the depth of the lateral cavities formed in the semiconductor layer on either side of said given region,
- a step of forming spacers against the sides of the gate, resting on the residual sacrificial layer,
- a step of totally removing the residual sacrificial layer present in the lateral cavities on either side of the given region and at least partially under the spacers in preparation for the step of forming the drain and the source.

The spin coating with an organic compound is particularly simple to implement. Moreover, the removal of this type of spin-coated organic compound is also particularly easy to control. Finally, spin coating has the advantage of being planarising, which avoids an additional step of chemical mechanical polishing (CMP).

BRIEF DESCRIPTION OF THE DRAWINGS

The goals, objects, features and advantages of the invention will be better understood from the detailed description of an embodiment of the invention that is illustrated by the following accompanying drawings, in which.

The annexed drawings are given as examples and are not limiting to the invention. They are schematic representations of a principle, intended to facilitate the understanding of the invention, and are not necessarily on the scale of the practical applications.

In particular, the relative thicknesses of the various layers and films are not representative of reality.

DETAILED DISCLOSURE OF PARTICULAR EMBODIMENTS

Before beginning a detailed review of embodiments of the invention, optional features that can optionally be used together or alternatively are listed below.

First of all, it is recalled that the invention relates to a method for forming at least one transistor from a stack comprising the following successive layers: an electrically insulating layer, an active zone comprising at least one semiconductor layer and a gate, the sides of which are intended to be covered by at least one spacer, the method comprising:
- a phase of forming lateral cavities on either side of a given region of the semiconductor layer suitable for forming a channel of the transistor, comprising a step of partially removing the semiconductor layer on either side of the given region, and
- a step of forming a raised drain and a raised source that fill the lateral cavities by growing the semiconductor layer via epitaxy.

The phase of forming lateral cavities comprises, after the step of partially removing the semiconductor layer:
- a step of forming a sacrificial layer on either side of the given region via spin coating with an organic compound, the sacrificial layer having a thickness at least equal to the depth of the lateral cavities formed in the semiconductor layer,
- a step of partially removing the sacrificial layer configured to preserve a residual sacrificial layer having a thickness at least equal to the depth of the lateral cavities formed in the semiconductor layer on either side of said given region,
- a step of forming spacers against the sides of the gate, resting on the residual sacrificial layer,
- a step of totally removing the residual sacrificial layer present in the lateral cavities on either side of the given region and at least partially under the spacers in preparation for the step of forming the drain and the source.

Advantageously, according to preferred but non-limiting alternatives, the invention can comprise at least any one of the following features and steps:

The step of partially removing the semiconductor layer is a step of partial anisotropic etching of the semiconductor layer in a direction perpendicular to a main plane in which the electrically insulating layer extends.

The residual semiconductor layer after the step of partial removal has a thickness greater than 3 nm.

The method comprises, before the step of partially removing the semiconductor layer, the formation of a carbon protective layer against the sides of the gate.

The given region is located in line with the gate. The sides of the given region are located in line with the gate sides.

The carbon protective layer has a thickness of 1 to 3 nm.

The method comprises a step of anisotropic etching of the protective layer in a direction perpendicular to a main plane in which the electrically insulating layer extends.

The organic compound of the sacrificial layer is a carbon compound and/or any polymer and/or any resin and/or any spin-coated carbon layer (SOC for spin on coating).

The step of partially removing the sacrificial layer and the step of removing the residual sacrificial layer are carried out via a plasma using oxidising or reducing chemistry.

The removal steps are controlled by the etching time.

The organic compound of the sacrificial layer is chosen from hydrogen silsesquioxane (HSQ) or $[RSiO_3/2]_n$, where R is a hydrogen or an alkyl or an alkoxy or a flowable oxide (Fox).

The step of partially removing the sacrificial layer and the step of removing the residual sacrificial layer are carried out via wet etching.

The given region is located vertically in line with the gate.

The given region has sides located in line with the sides of the gate.

According to another aspect, the invention relates to a method for forming at least an nMOS transistor and a pMOS transistor on the same plate comprising by implementing the method according to any of the preceding claims, wherein the phase of forming the lateral cavities is carried out simultaneously for the nMOS and pMOS transistors; and comprising:
  after the step of totally removing the residual sacrificial layer present in the lateral cavities on either side of the given region, a step of forming an encapsulation block in order to protect one transistor taken from the nMOS and pMOS transistor; then
  a step of forming the source and the drain of the other transistor taken from the nMOS and pMOS transistor; then
  a step of removing the encapsulation block protecting said transistor taken from the nMOS and pMOS transistor; then
  a step of forming an encapsulation block in order to protect said other transistor taken from the nMOS and pMOS transistor; then
  a step of forming the source and the drain of said transistor taken from the nMOS and pMOS transistor.

Advantageously, the method comprises, after the step of removing the encapsulation block protecting said transistor taken from the nMOS and pMOS transistor and before the step of forming an encapsulation block for protecting said other transistor taken from the nMOS and pMOS transistor, a step of depositing an insulating layer both on the nMOS transistor and on the pMOS transistor.

According to another aspect, the invention relates to a storage method.

It is specified that in the context of the present invention, the terms "on", "is on top of", "covers" and "underlying" and the equivalents thereto do not necessarily mean "in contact with." Thus, for example, the deposition of a first layer on a second layer does not necessarily mean that the two layers are directly in contact with each other, but this means that the first layer at least partly covers the second layer while either being directly in contact with it or being separated from it by another layer or another element.

In the following description, the thicknesses are generally measured in directions perpendicular to the plane of the lower face of the layer to be etched or of a substrate on which the lower layer is positioned. Thus, the thicknesses are generally taken in a vertical direction on the drawings shown. However, the thickness of a layer covering a side of a pattern is taken in a direction perpendicular to said side.

The terms "layer" and "film" are understood to be synonyms.

A "thin layer" means a layer having a thickness that varies from several atomic layers to several micrometres.

Microelectronic device means any device made with means from microelectronics. In addition to the devices having a purely electronic purpose, these devices include, in particular, micromechanical or electromechanical devices (MEMS, NEMS . . . ) and optical or optoelectronic devices (MOEMS . . . ).

Figure 3A:
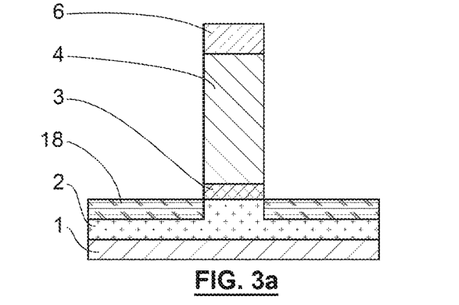
FIGS. 3a) to 3h) illustrate the manufacturing method according to an embodiment of the invention.

The method according to the invention starts with a stack illustrated in FIG. 3a). This stack comprises an electrically insulating layer 1 on which an active zone and a gate 4 above the active zone are arranged in contact. The active zone comprises at least one layer of semiconductor material 2. The gate 4 comprises a plurality of layers, in particular including a base layer 3 in contact with the layer of semiconductor material 2. This base layer 3 is a highly conductive layer called High-K layer, consisting of metal and an insulating layer, preferably having a dielectric constant greater than or equal to 4, preferably 10. The gate 4 above this base layer 3, is advantageously made of polycrystalline silicon, the top of which is protected by a hard mask 6.

The layer of semiconductor material 2 is made of silicon or contains silicon, for example made of silicon-germanium with a percentage of germanium from 20% to 80% or made of germanium.

The electrically insulating layer 1 is also called buried oxide or Box. This layer 1 is advantageously a silicon oxide.

The method according to the invention comprises a phase of forming lateral cavities 9 on either side of a given region 10 of the semiconductor layer 2 followed by a step of forming a raised drain and raised source 7 that fill the lateral cavities 9 via epitaxial growth of the semiconductor layer 2.

This phase of forming the lateral cavities 9 comprises a plurality of successive steps. The first step of this formation step is a step of partially removing the layer of semiconductor material 2. This step of partial removal allows the configuration illustrated in FIG. 3b) to be obtained. The step of partial removal allows blocks 18 of the semiconductor layer 2, located on either side of a given region 10 intended to form the channel of the transistor, to be removed.

Figure 3B:
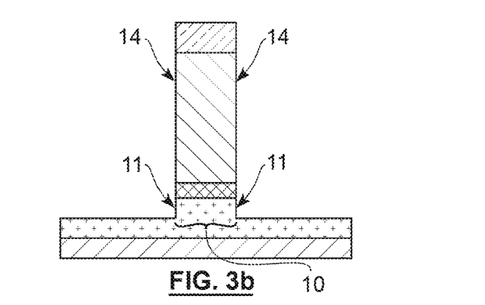

The partial removal step is advantageously a step of partial anisotropic etching of the layer of semiconductor material 2. The anisotropic etching is carried out in a direction perpendicular to a main plane in which the electrically insulating layer mainly extends.

This etching step can also etch the gate 4 as is visible from FIG. 3a) to FIG. 3b) in which it can be seen that the width of the gate 4 is reduced by the anisotropic etching.

According to one preference, this etching step is carried out by modification via implantation of ions from a plasma. This etching allows etching of the gate 4 and in particular of the base layer 3 as well as of the semiconductor layer 2 in the same etching reactor. Preferably in an inductively coupled reactor using chemistry based on Chlorine or Fluorine. The control of the etching in order to obtain partial etching of the semiconductor layer 2, is obtained by a system for detecting the end of an attack or via interferometry. By selecting a certain emission line of the plasma, the various interfaces etched over time can be seen. For example, the etched thickness of the semiconductor layer 2 is approximately 6 to 9 nm.

Advantageously, the partial etching of the semiconductor layer is carried out in such a way that at least a thickness of silicon greater than 3 nm remains. This minimum thickness allows the step of growth via epitaxy described below to be carried out. The gate 4 acts as a mask for carrying out this step of partial etching.

This etching step leaves intact a given region 10 of the semiconductor layer 2. This given region 10 is suitable for forming a channel of the transistor. This given region is arranged vertically in line with the gate 4. The given region 10 is facing the gate 4. The sides 11 of the given zone 10 are in-line with the sides 14 of the gate 4. If the material of the source and of the drain 7 is suitable for producing a stress, the stress on the given zone 10 will be as close as possible to the gate 4 in order to limit the parasitic capacitances that allow the dopants to be as close as possible to the gate. For this, said material is a semiconductor different from that of the given region 10 and is chosen in such a way as to be able to stretch the atoms of the material of said given region 10 beyond their ordinary interatomic distance. The sides are surfaces that extend transversely, preferably perpendicularly, to the main plane in which the electrically insulating layer 1 extends.

Figure 3C:
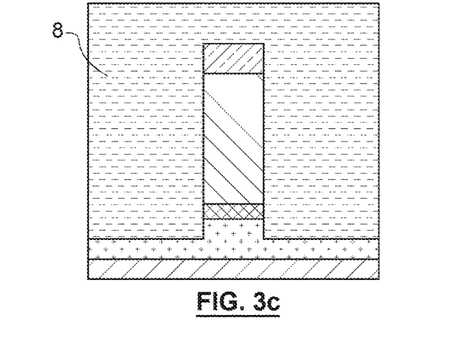

The phase of forming the lateral cavities 9 then advantageously comprises a step of forming a sacrificial layer 8. According to the invention, the sacrificial layer 8 is formed by spin coating. The sacrificial layer 8 is arranged on either side of the given region 10. According to one possibility, the sacrificial layer 8 is arranged in contact with the sides 14 of the gate 4. The sacrificial layer 8 is formed before any step of forming a spacer on the sides 14 of the gate 4. This step order is possible according to the invention since the sacrificial layer is made from an organic material and the spin coating thereof does not risk damaging the gate namely via phenomena of growth of the gate via epitaxy that would occur if the sacrificial layer were formed via epitaxy.

The thickness of the sacrificial layer 8 is greater than the thickness of the given region 9 of the semiconductor layer 2. Preferably, the sacrificial layer 8 covers the gate 4 and its hard mask 6. Preferably, the sacrificial layer 8 has a thickness greater than 100 nm and less than 300 nm.

This type of deposition has the advantage of being planarising and thus generates a flat surface vertically aligned with the gate 4 as illustrated in FIG. 3c).

The sacrificial layer 8 is made from an organic compound chosen from carbon, any polymer, resin, SOC (spin-on coating). The material of the sacrificial layer is intended to be able to be etched selectively with respect to the semiconductor layer 2 in particular.

Figure 3D:
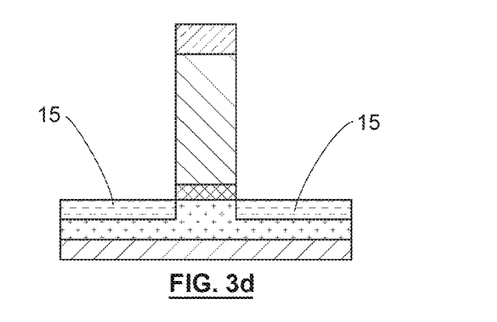

The phase of forming the lateral cavities 9 then comprises a step of partially removing the sacrificial layer 8. This step of partially removing the sacrificial layer 8 is intended to reduce the thickness of the sacrificial layer 8 and in particular free the sides 14 of the gate 4 in order to allow them to be protected by spacers 5. The partial removal is configured to preserve a residual sacrificial layer 15 on either side of the given region 10. The residual sacrificial layer 15 advantageously has a thickness less than or equal to the thickness of the given region 10 of the semiconductor layer 2. A difference in height of approximately 1 to 2 nm, for example, can be provided in order to avoid later creating a short-circuit between the gate 4 and the source 7 and the drain 7.

This step of partially removing the sacrificial layer 8 is advantageously a step of anisotropic etching of the sacrificial layer 8 in a direction perpendicular to a main plane in which the electrically insulating layer 1 extends.

The etching is carried out via plasma in an inductively or capacitively coupled reactor using oxidising or reducing chemistry, a step well known to a person skilled in the art.

The etching of an organic layer by a plasma has good selectivity with respect to the gate 4.

Preferably, this etching is carried out in time in such a way as to stop the etching at the interface of the base layer 3 with the semiconductor layer 2.

For example, to etch 100 nm of carbon, the following conditions can be used:

900 w (acts on the dissociation)-250 v (acts on energy of the ions)-10 mTorr-SO2:250 sccm-02:30 sccm-He:50 sccm-60° C., the Oxygen allows the Carbon to be etched, the sulphur allows the sides to be passivated in order to prevent lateral etching. The etching is controlled in terms of time.

Etching speed of the carbon: 240 nm/min

According to one alternative, the sacrificial layer 8 is made from an organic compound chosen from hydrogen silsesquioxane (HSQ) or $[RSiO_3/2]_n$, where R is a hydrogen or an alkyl or an alkoxy or a flowable oxide (Fox).

In this case, the step of partially removing the sacrificial layer 8 is carried out via a wet process. For example, wet etching with HF at 1% can be used. This type of etching, however, is more difficult to control in order to allow partial etching. Problems of uniformity are also sometimes noted. In this case, it is preferred that the spacers 5 of the gate 4 be made from a material different than the Silicon Nitride that is consumed by the HF.

According to another alternative, the sacrificial layer 8 is made from an organic compound chosen from a methyl Silsesquioxane (such as SiOCH). In this case, the partial etching of the sacrificial layer 8 is carried out in two steps. Preferably, it starts with a modification, by reactive species from a remote plasma (downstream plasma), or from a modification by ions from an oxidising or reducing capacitively coupled plasma (CCP), of the SiOCH, which is thus transformed into SiO2. The sacrificial layer 8 is partially modified. The modified zone has a different etching selectivity than the non-modified zone. The etching continues with wet cleaning (HF) of the modified zone. This type of etching is, however, more difficult to control in terms of the depth of the modification of the sacrificial layer 8 and thus of the removal. In this case, it is preferred that the spacers of the gate 4 be made from a material different than the Silicon oxide that is consumed by the HF.

Figure 4A:
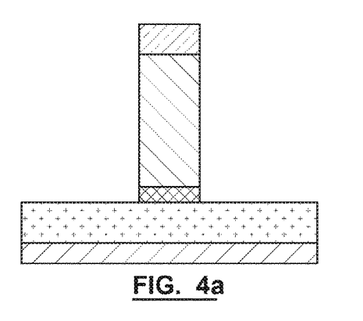
FIGS. 4a) to 4j) illustrate a variant of the manufacturing method according to FIG. 3.
Figure 4B:
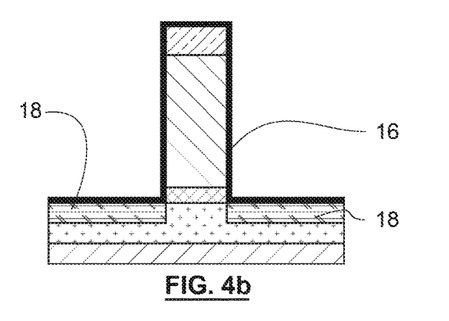
Figure 4C:
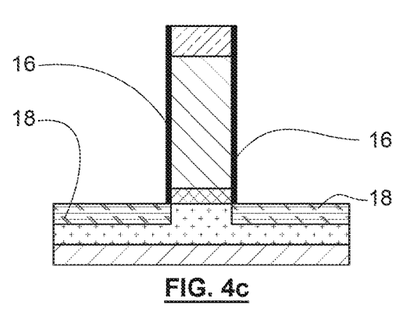
Figure 4D:
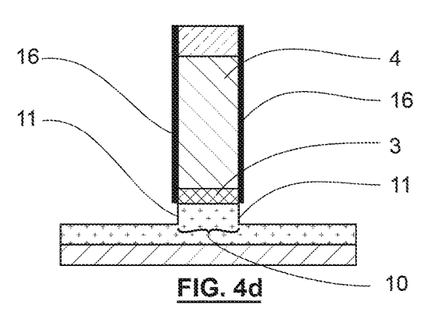
Figure 4E:
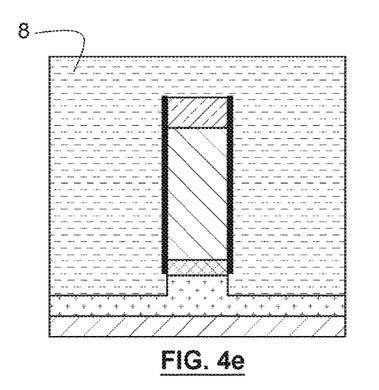
Figure 4F:
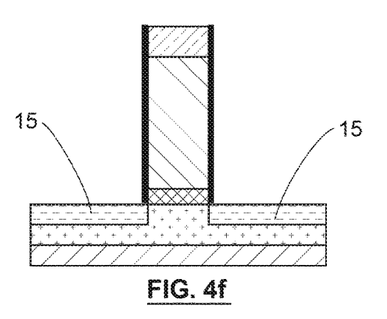
Figure 4G:
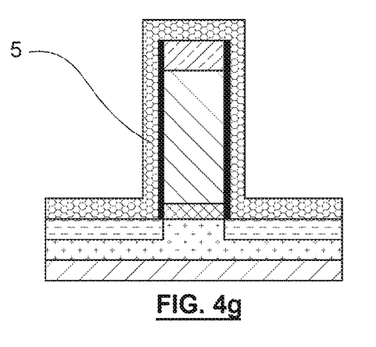
Figure 4H:
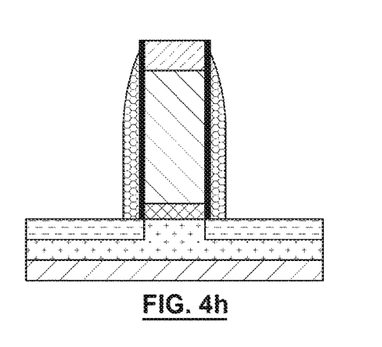
Figure 4I:
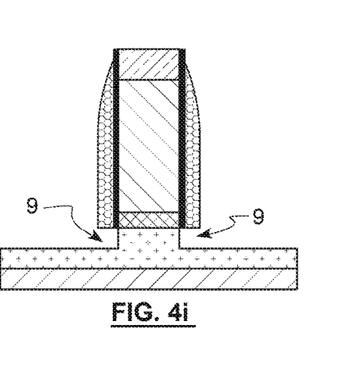
Figure 4J:
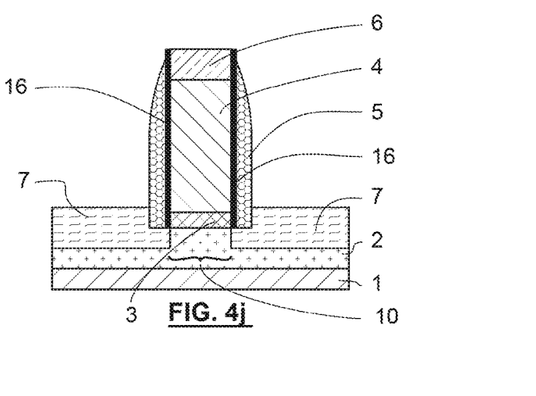

According to these two alternatives, the method advantageously comprises a phase of protecting the gate 4 and more particularly the base layer 3 that contains a highly conductive element. This phase of protecting the gate is illustrated in FIGS. 4b) and 4c).

In this phase of the method according to the invention, a step of depositing a protective layer 16, in particular of carbon, is carried out before starting the step of partially removing the semiconductor layer 2. This protective layer 16 has a thickness from 1 to 3 nm. The protective layer 16 is deposited over the entirety of the surfaces of the stack as illustrated in FIG. 4a).

After the deposition step, the protection phase comprises a step of anisotropic etching of the protective layer 16. This anisotropic etching is carried out in a direction parallel to the main plane in which the electrically insulating layer 1 extends. The surface of the semiconductor layer 2 does not therefore have the protective layer 16. This protective layer 16 thus covers the sides 14 of the gate 4 advantageously over its entire height but at least mainly at the interface between the base layer 3 and the semiconductor layer 2. This protective layer 16 allows any risk of contact between the source 7 and the drain 7 with the base layer 3 to be prevented. Indeed, as indicated above for the two latter alternatives, the control of the etching is difficult and it is possible to have variations in the wet etching that lead either to overetching, which means that the residual sacrificial layer 15 is located under the base layer 3. In this case, the sides of the base layer 3 would be protected by the gate 4 spacer 5, or underetching, which means that the residual sacrificial layer 15 is located at the level of or above the base layer 3. In this case, the sides of the base layer 3 would not be protected by the gate 4 spacer 5 and they risk being in contact with the source and the drain 7, leading to a risk of short-circuit. The presence of the protective layer 16 on the sides 14 at least of the base layer 3 allows this risk to be avoided.

Figure 3E:
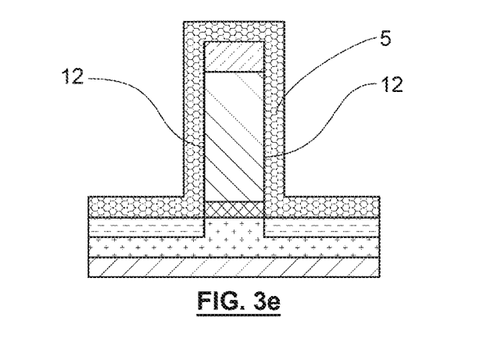

The phase of forming the lateral cavities 9 comprises a subsequent step of forming spacers 5 against the sides 14 of the gate 4. The spacers 5 rest on the residual sacrificial layer 15. Preferably, a conformal spacer 5 is deposited around the gate 4. The spacer 5 can be made of SiN or of a material having a dielectric constant less than or equal to 7, called Low-k, or SiCN, SiCO, SiBCN . . . .

Preferably, the spacer 5 has a thickness between 5 to 20 nm.

This spacer 5, conventionally silicon nitride (SiN), is then etched by a plasma. The conventional chemistry for etching this material is chemistry that uses CH3F/He/O2. The criteria of this etching are anisotropic etching stopping on the residual sacrificial layer 15. Contrary to the standard approach, in which it is necessary to etch the spacer without damaging the semiconductor layer 2, in the present invention, this criterion corresponding to the stoppage of the etching on the residual sacrificial layer 15 is not critical since the following step is the removal of this layer from the residual sacrificial layer 15.

Figure 3F:
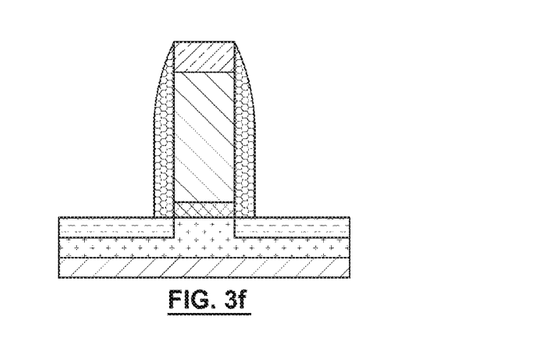

After this step of forming the spacers 5, the method according to the invention comprises, during the phase of forming the lateral cavities 9, a step of removing the residual sacrificial layer 15. This residual sacrificial layer 15 allowed the lateral cavities 9 to be temporarily filled during the formation of the spacers 5. The residual sacrificial layer formed the support for the spacers 5. This layer can now be removed. The step of removing the residual sacrificial layer 15 is advantageously identical to the step of partially removing the sacrificial layer 8. The removal step is carried out up to under the spacers 7, advantageously, up to the sides 19 of the given region 10. If the sacrificial layer is a carbon layer, the removal is preferably carried out via implantation of ions from a plasma without bias in order to limit the oxidation and thus the modification of the conductive materials on horizontal surfaces, that is to say, parallel to the main plane in which the electrically insulating layer extends.

Once this residual sacrificial layer 15 has been removed, the configuration of FIG. 3f) is obtained. In this configuration, the lateral cavities 9 are formed. According to the invention, the lateral cavities 9 are said to penetrate under the spacers 5. Lateral cavity 9 means a recess that leaves a space between the semiconductor layer 2 and the gate spacer 5 on either side of the given region 10. The semiconductor layer 2 and the spacer 5 are spaced apart by the cavity 9 on either side of the given region 10. The gate spacer 5 covers the semiconductor layer 2, without contact, on either side of the given region 10.

The lateral cavities 12 extend from the sides 11 of the given region 10 to their openings.

Figure 3G:
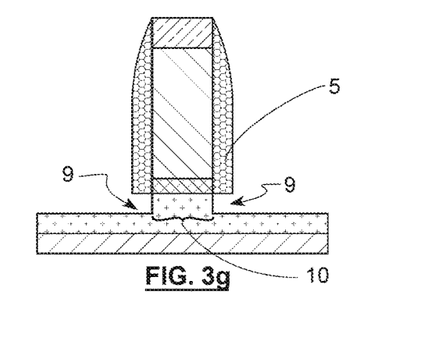
Figure 3H:
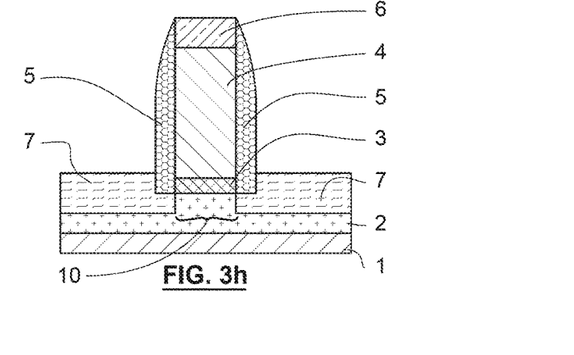

Advantageously, the method according to the invention continues with a step of growth via epitaxy of the semiconductor layer 2 in such a way as to form a raised drain and source 7 that fill the lateral cavities 9. "Raised" is understood to mean that the source and the drain 7 are positioned on either side of the gate 4 and extend at least partially above given region 10 said semiconductor layer 2 in which the channel region is intended to be located. The source and the drain 7 protrude with respect to the upper face of the channel. The source and the drain 7 extend above the upper face of the semiconductor layer 2 in the given region 10 and comprise a portion that extends under the spacers 5. The source and the drain 7 penetrate in order to be in contact with the sides 19 of the given region 10, that is to say, in contact with the channel.

The configuration of FIG. 3g) is obtained.

Preferably, for an nMOS transistor, the growth via epitaxy is carried out with in situ Phosphorus doping (SiC:P), and for a pMOS transistor, the growth via epitaxy is carried out with in situ Boron doping (SiGe:B).

The method according to the invention has the advantage of being compatible with the formation of nMOS and pMOS transistors, advantageously simultaneously as illustrated in FIG. 5.

In this alternative, the steps of partially removing the semiconductor layer 2, forming the sacrificial layer 8 on either side of the given region 10, and partially removing a residual sacrificial layer 15, and the compliant deposition of gate spacers 5 are common to the nMOS transistor and pMOS transistor.

Figure 5A:
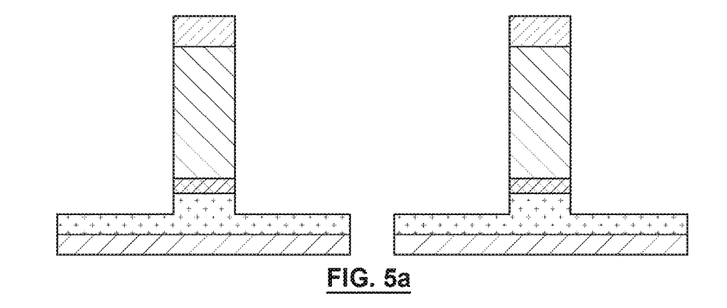
FIGS. 5a) to 5i) illustrate a manufacturing method according to FIG. 3 applied to the simultaneous manufacturing of an NMOS and PMOS transistor.
Figure 5B:
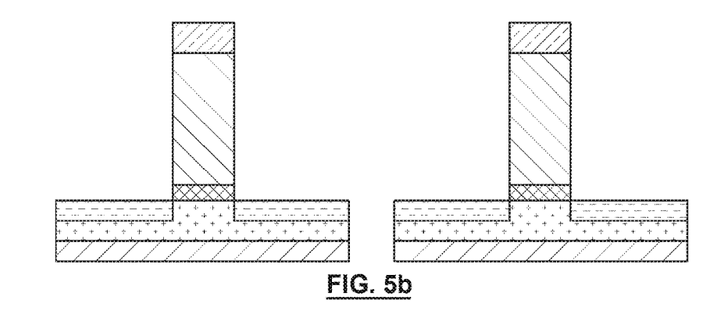
Figure 5C:
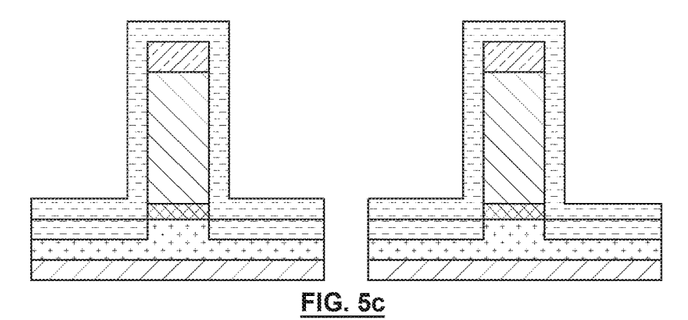
Figure 5D:
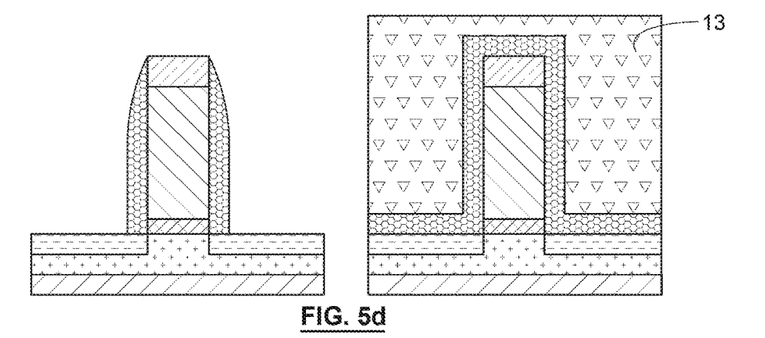
Figure 5E:
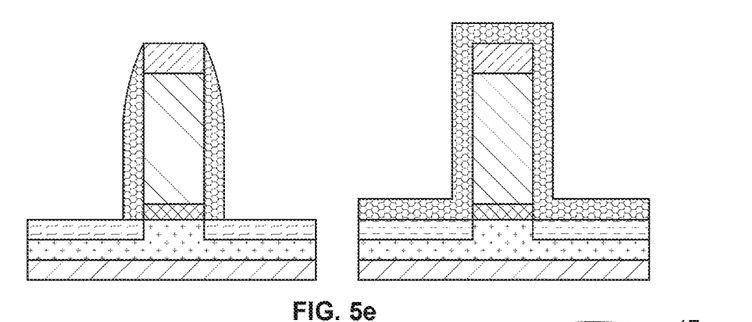

Then, the pMOS transistor is protected by a layer or an encapsulation block 13, typically a layer or a block of resin, namely an SOC spin-on coating layer (carbon) or a layer made of resin, and the method according to the invention is continued only for the nMOS transistor. The gate spacer 5 of the nMOS transistor is etched via anisotropic etching in a direction perpendicular to a main plane in which the electrically insulating layer extends. The steps of totally removing the residual sacrificial layer 15 and the formation of the drain and of the source are carried out on the nMOS transistor. Preferably, the pMOS transistor is unprotected by removal of the resin between the step of totally removing the residual sacrificial layer 15 and the step of forming the drain and the source. This step of removing the resin is for example carried out by modification via N2/H2 plasma and etching of the modified resin.

Figure 5F:
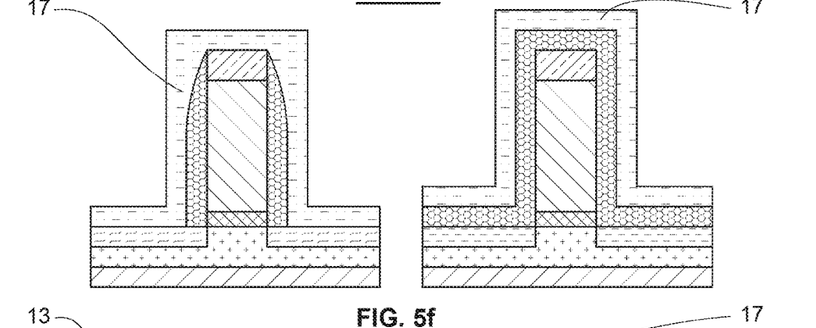

Then, the method comprises a step of conformal deposition of an insulating layer 17 identical to the layer 5, SiN or Low-k. This deposition step is carried out on the nMOS transistor and on the pMOS transistor.

Figure 5G:
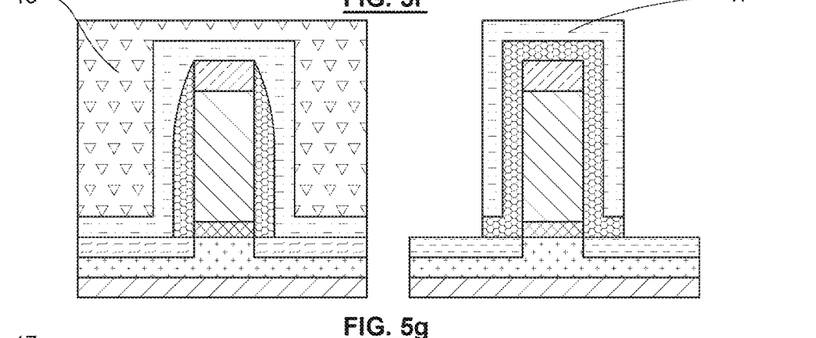

A step of protecting the nMOS transistor is carried out by forming a layer or an encapsulation block 13, typically via deposition of resin on the nMOS transistor.

Figure 5H:
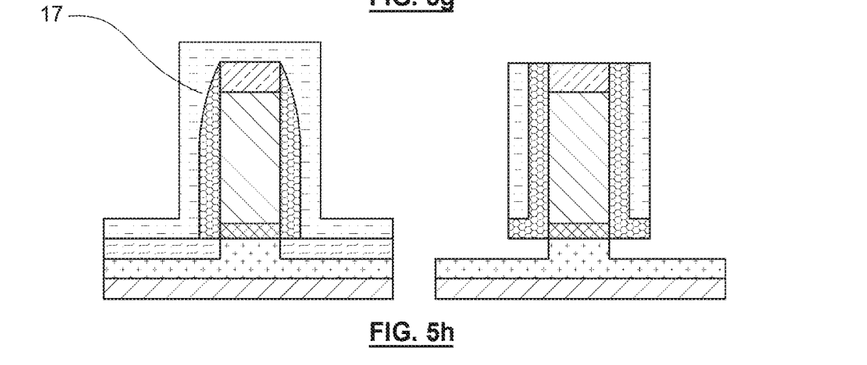

The pMOS transistor undergoes a step of anisotropic etching of the spacer 5 and of the insulating layer 17, in a direction perpendicular to a main plane in which the electrically insulating layer extends.

Advantageously, the nMOS transistor can be unprotected by removal of the encapsulation block 13 at that time.

Figure 5I:
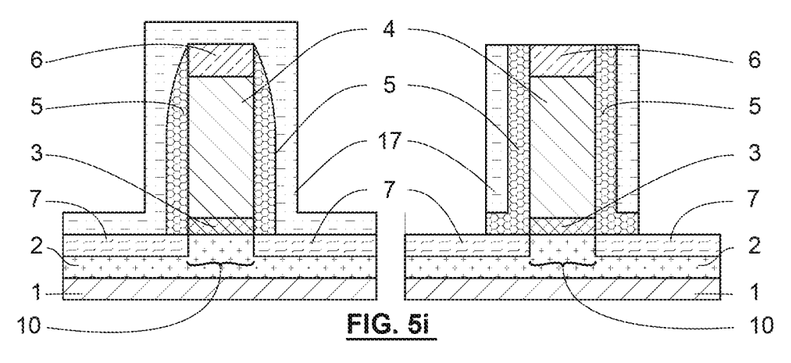

The step of totally removing the residual sacrificial layer 15 is carried out for the pMOS transistor and is followed by the formation of the drain and of the source of the pMOS.

REFERENCES

1. Electrically insulating layer
2. Semiconductor layer
3. High K layer
4. Gate
5. Gate spacers
6. Hard Mask
7. Source-drain
8. Sacrificial layer
9. Lateral cavity 10. Given region
11. Sides of the given zone
12. Gate spacer-gate interface
13. Encapsulation block
14. Sides of the gate
15. Residual sacrificial layer
16. Carbon layer
17. Insulating layer
18. Blocks
100. Transistor
105. ion implantation
110. drain source
112. growth
120. gate
123. poly crystalline silicon
130. channel
140. Silicon on Insulator (SOI)
142. substrate
144. Buried oxide
146. monocrystalline silicon
150. Spacers

The invention claimed is:

1. A method for forming at least one transistor from a stack comprising the following successive layers: an electrically insulating layer, an active zone comprising at least one semiconductor layer, and a gate, sides of which are configured to be covered by at least one spacer, the method comprising:
   a phase of forming lateral cavities on either side of a given region of the semiconductor layer for forming a channel of the transistor, comprising a step of partially removing the semiconductor layer on said either side of the given region; and
   a step of forming a raised drain and a raised source that fill the lateral cavities by growing the semiconductor layer via epitaxy,
   wherein the phase of forming the lateral cavities comprises, successively after the step of partially removing the semiconductor layer:
      a step of forming a sacrificial layer on said either side of the given region via spin coating with an organic compound, the sacrificial layer having a thickness at least equal to a depth of the lateral cavities formed in the semiconductor layer,
      a step of partially removing the sacrificial layer performed so as to preserve a residual sacrificial layer having a thickness at least equal to the depth of the lateral cavities formed in the semiconductor layer on either side of said given region,
      a step of forming spacers against the sides of the gate, resting on the residual sacrificial layer, and
      a step of totally removing the residual sacrificial layer present in the lateral cavities on said either side of the given region and at least partially under the spacers in preparation for the step of forming the raised drain and the raised source.

2. The method according to claim 1, wherein the step of partially removing the semiconductor layer is a step of partial anisotropic etching of the semiconductor layer in a direction perpendicular to a main plane in which the electrically insulating layer extends.

3. The method according to claim 1, wherein the semiconductor layer after the step of partial removal has a thickness greater than 3 nm.

4. The method according to claim 1, further comprising, before the step of partially removing the semiconductor layer, forming a carbon protective layer against the sides of the gate.

5. The method according to claim 4, wherein the carbon protective layer has a thickness of 1 nm to 3 nm.

6. The method according to claim 4, further comprising a step of anisotropic etching of the carbon protective layer in a direction perpendicular to a main plane in which the electrically insulating layer extends.

7. The method according to claim 1, wherein the organic compound of the sacrificial layer is a carbon compound and/or any polymer and/or any resin and/or any spin-coated carbon layer (SOC).

8. The method according to claim 7, wherein the step of partially removing the sacrificial layer and the step of removing the residual sacrificial layer are performed via a plasma using oxidising or reducing chemistry.

9. The method according to claim 8, wherein the partially removing is controlled by etching time.

10. The method according to claim 1, wherein the organic compound of the sacrificial layer is chosen from hydrogen silsesquioxane (HSQ) or $[RSiO_3/2]_n$, where R is a hydrogen or an alkyl or an alkoxy or a flowable oxide (Fox).

11. The method according to claim 10, wherein the step of partially removing the sacrificial layer and the step of removing the residual sacrificial layer are performed via wet etching.

12. The method according to claim 1, wherein the given region is located vertically in line with the gate.

13. The method according to claim 1, wherein the given region has sides facing the sides of the gate.

14. A method for forming at least an nMOS transistor and a pMOS transistor on a same plate, implementing the method according to claim 1, wherein the phase of forming the lateral cavities is carried out simultaneously for the nMOS and the pMOS transistors, and comprises:
   after the step of totally removing the residual sacrificial layer present in the lateral cavities on either side of the given region, a step of forming an encapsulation block in order to protect one transistor taken from the nMOS and the pMOS transistor; then
   a step of forming the source and the drain of the other transistor taken from the nMOS and the pMOS transistor; then
   a step of removing the encapsulation block protecting said transistor taken from the nMOS and the pMOS transistor; then
   a step of forming another encapsulation block in order to protect said other transistor taken from the nMOS and the pMOS transistor; and then
   a step of forming the source and the drain of said transistor taken from the nMOS and the pMOS transistor.

15. The method according to claim 14, further comprising, after the step of removing the encapsulation block protecting said transistor taken from the nMOS and the pMOS transistor and before the step of forming another encapsulation block in order to protect said other transistor taken from the nMOS and the pMOS transistor, a step of depositing an insulating layer both on the nMOS transistor and on the pMOS transistor.

16. A method for forming at least one transistor from a stack comprising the following successive layers: an electrically insulating layer, an active zone comprising at least one semiconductor layer, and a gate, sides of which are configured to be covered by at least one spacer, the method comprising:
- a phase of forming lateral cavities on either side of a given region of the semiconductor layer for forming a channel of the transistor, comprising a step of partially removing the semiconductor layer on said either side of the given region; and
- a step of forming a raised drain and a raised source that fill the lateral cavities by growing the semiconductor layer via epitaxy,
- wherein the phase of forming the lateral cavities comprises, successively after the step of partially removing the semiconductor layer:
  - a step of forming a sacrificial layer on said either side of the given region via spin coating with an organic compound, the sacrificial layer having a thickness at least equal to a depth of the lateral cavities formed in the semiconductor layer,
  - a step of forming a carbon protective layer against the sides of the gate,
  - a step of partially removing the sacrificial layer performed so as to preserve a residual sacrificial layer having a thickness at least equal to the depth of the lateral cavities formed in the semiconductor layer on either side of said given region,
  - a step of forming spacers against the sides of the gate, resting on the residual sacrificial layer, and
  - a step of totally removing the residual sacrificial layer present in the lateral cavities on said either side of the given region and at least partially under the spacers in preparation for the step of forming the raised drain and the raised source.

17. A method for forming at least one transistor from a stack comprising the following successive layers: an electrically insulating layer, an active zone comprising at least one semiconductor layer, and a gate, sides of which are configured to be covered by at least one spacer, the method comprising:
- a phase of forming lateral cavities on either side of a given region of the semiconductor layer for forming a channel of the transistor, comprising a step of partially removing the semiconductor layer on said either side of the given region; and
- a step of forming a raised drain and a raised source that fill the lateral cavities by growing the semiconductor layer via epitaxy,
- wherein the phase of forming lateral cavities comprises, successively after the step of partially removing the semiconductor layer:
  - a step of forming a sacrificial layer on said either side of the given region via spin coating with an organic compound, the sacrificial layer being deposited in contact with the sides of the gate, the sacrificial layer having a thickness at least equal to a depth of the lateral cavities formed in the semiconductor layer,
  - a step of partially removing the sacrificial layer performed so as to preserve a residual sacrificial layer having a thickness at least equal to the depth of the lateral cavities formed in the semiconductor layer on either side of said given region,
  - a step of forming spacers against the sides of the gate, resting on the residual sacrificial layer, and
  - a step of totally removing the residual sacrificial layer present in the lateral cavities on said either side of the given region and at least partially under the spacers in preparation for the step of forming the raised drain and the raised source.

* * * * *